(12) United States Patent
Oishi et al.

(10) Patent No.: US 6,831,841 B2
(45) Date of Patent: Dec. 14, 2004

(54) FLEXIBLE SUBSTRATE, ELECTRO-OPTICAL DEVICE AND ELECTRONIC DEVICE

(75) Inventors: Eiji Oishi, Nagano-ken (JP); Masanori Yumoto, Matsumotoshi (JP); Yasuhito Aruga, Matsumotoshi (JP)

(73) Assignee: Seiko Epson Corporation (JP)

( * ) Notice: Subject to any disclaimer, the term of this patent is extended or adjusted under 35 U.S.C. 154(b) by 252 days.

(21) Appl. No.: 10/085,494

(22) Filed: Feb. 26, 2002

(65) Prior Publication Data

US 2002/0117328 A1 Aug. 29, 2002

(30) Foreign Application Priority Data

Feb. 28, 2001 (JP) .......................... 2001-054609

(51) Int. Cl.⁷ .................. H05K 7/02; H05K 7/06; H05K 7/08; H05K 7/10
(52) U.S. Cl. .................. 361/760; 361/749; 174/254
(58) Field of Search ........................ 361/749, 760; 174/254; 349/150; 345/100, 87

(56) References Cited

U.S. PATENT DOCUMENTS

| 4,474,432 A | * | 10/1984 | Takamatsu et al. .......... 349/150 |
| 5,161,009 A | * | 11/1992 | Tanoi et al. ................. 349/150 |
| 5,841,414 A | * | 11/1998 | Tanaka .......................... 345/87 |
| 6,476,789 B1 | * | 11/2002 | Sakaguchi et al. .......... 345/100 |
| 6,657,696 B2 | * | 12/2003 | Aruga ......................... 349/150 |

* cited by examiner

Primary Examiner—David Zarneke
Assistant Examiner—Tuan Dinh
(74) Attorney, Agent, or Firm—Harness, Dickey & Pierce, P.L.C.

(57) ABSTRACT

A first driver IC is mounted in the area which includes one side of the panel substrate on an electro-optical panel, and the edge portion of the film base material on which a second driver IC is mounted is bonded to the vicinity of the one side of the above-mentioned panel substrate. Also, driver-controlling electronic components which each provides control signals to the first and second driver ICs are mounted on the same surface as the second driver IC in the film base material.

13 Claims, 9 Drawing Sheets

FLEXIBLE SUBSTRATE, ELECTRO-OPTICAL DEVICE AND ELECTRONIC DEVICE

BACKGROUND OF THE INVENTION

1. Technical Field of the Invention

The present invention relates to a flexible substrate, an electro-optical device, and an electronic device.

2. Description of the Related Art

Hitherto, as display devices for various electronic devices, electro-optical devices typified by liquid crystal display devices and EL (electroluminescence) display devices have been in widespread use. As this type of electro-optical device, there is a known arrangement wherein an IC chip which produces signals for driving an electro-optical substance such as a liquid crystal or an EL element is mounted, by the COG (chip on glass) mount technique, on a panel substrate which holds the above-mentioned electro-optical substance. Furthermore, in order to address the increase in the number of electrodes attendant upon the advance of higher definition displays, an arrangement wherein a plurality of IC chips is mounted on panel substrates, has also been proposed.

Figure 10:
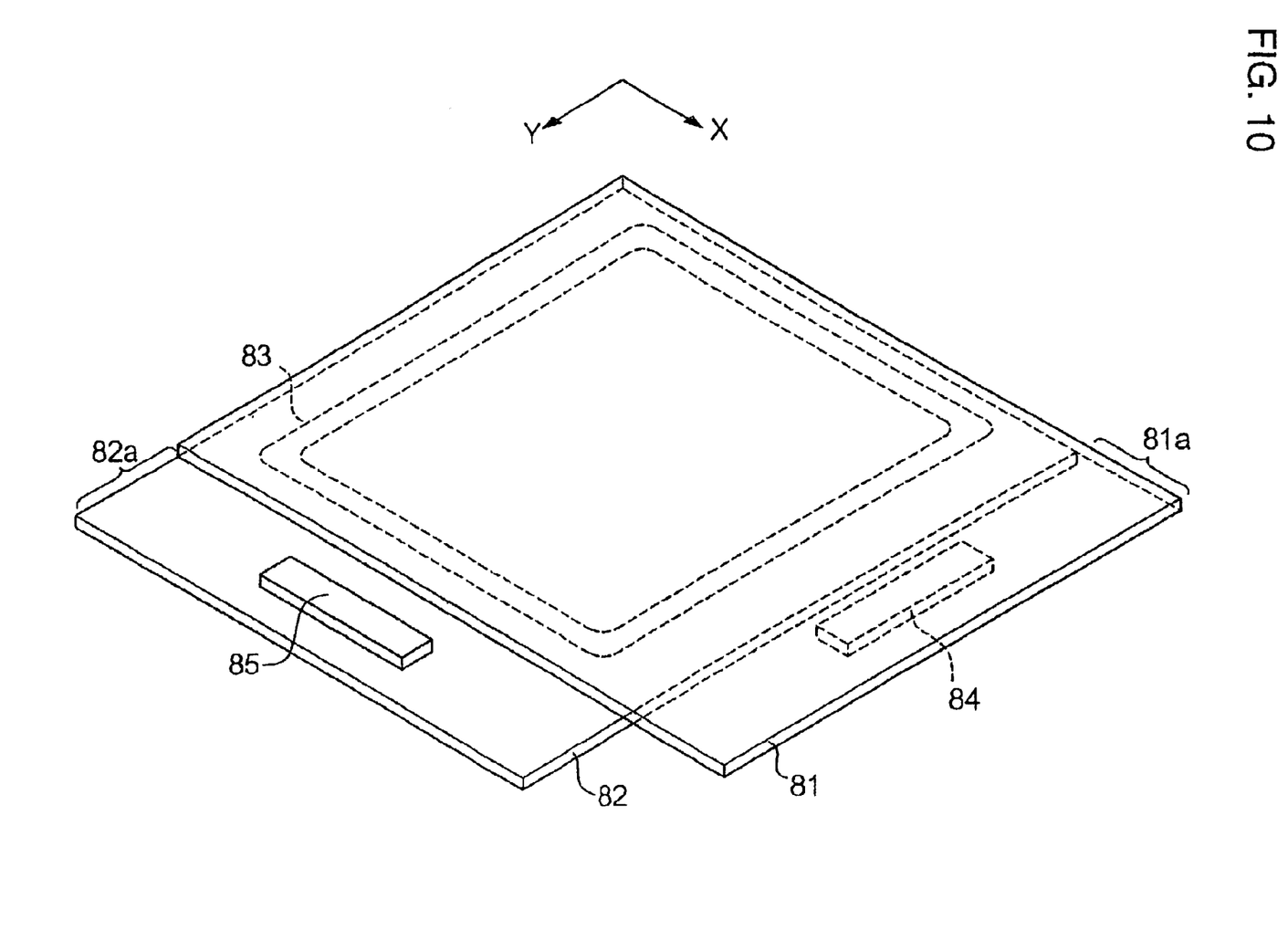
FIG. 10 is a perspective view showing the configuration of a conventional liquid crystal display panel.

FIG. 10 is a perspective view illustrating the configuration of an electro-optical device (a liquid crystal device in this case) having a plurality of chips. As shown in the figure, this electro-optical device is configured so that a first panel substrate 81 and a second panel substrate 82 wherein electrodes are formed between the opposite surfaces thereof, are adhered together with a seal material 83 interposed therebetween, and that an electro-optical substance (a liquid crystal) is sealed between the two substrates. The first panel substrate 81 has a projecting area 81a which projects with respect to the second panel substrate 82, and a first driver IC 84 for providing a driving signal to the electrode on the first panel substrate 81 is mounted in the area 81a. Likewise, the second panel substrate 82 has a projecting area 82a which projects with respect to the first panel substrate 81, and a second driver IC 85 for providing a driving signal to the electrode on the second panel substrate 82 is mounted in the area 82a.

However, when the arrangement shown in FIG. 10 is adopted, both of the two panel substrates have a projecting area (81a or 82a) which projects on one side with respect to the other panel substrate, so that a problem arises in that the shape of the picture-frame like region in the above-described electro-optical device, that is, the shape of the area outside the seal material 83, is not bilaterally symmetrical in either the X direction or the Y direction. In contrast, the enclosure of an electronic device such as a portable telephone generally has a bilaterally symmetrical shape. This raises a problem that the electronic device in each of the conventional electro-optical devices has inferior properties for being incorporated into the enclosure.

The present invention has been developed in light of the above-described problems, and it is an object of the present invention to provide an electro-optical device allowing the shape of the picture-frame like region to be symmetrical, an electronic device having this electro-optical device, and a flexible substrate used therein.

SUMMARY OF THE INVENTION

To solve the above-described problems, the present invention provides a flexible substrate bonded to an electro-optical panel in which a first driver IC is mounted in the area which includes one side of a panel substrate. This flexible substrate comprises a base material wherein the edge portion thereof is bonded to the vicinity of the one side of the panel substrate; a second driver IC mounted on the surface of the base material; and driver-controlling electronic components which are mounted on the same surface as the second driver IC in the base material, and which produce control signals to be provided to the first and second driver ICs.

According to this flexible substrate, the first driver IC is mounted on the panel substrate while the second driver IC is mounted on the base material. It is unnecessary, therefore, to mount the second driver IC, for example, in the vicinity of the side adjacent to one side on the first driver IC side in the panel substrate, and hence, the shape of the picture-frame like region in the electro-optical device can be made symmetrical with respect to the symmetrical axis in the direction perpendicular to the above-mentioned one side. Furthermore, since the second driver IC and the driver-controlling electronic components are mounted on the same surface in the base material, the processes of mounting these components can be facilitated.

Also, to solve the above-described problems, the present invention provides a flexible substrate bonded to an electro-optical panel in which a first driver IC is mounted in the area which includes one side of a panel substrate. This flexible substrate comprises a base material wherein the edge portion thereof is bonded to the vicinity of the one side of the panel substrate; a second driver IC mounted on the surface of the base material; and driver-controlling electronic components which are mounted in the electronic component mounting area situated between the edge portion bonded to the panel substrate and the area where the second driver IC are mounted, in the base material, and which produce control signals to be provided to the first and second driver ICs.

According to this flexible substrate, as in the foregoing, the shape of the picture-frame like region in the electro-optical device can be made symmetrical. Moreover, since the electronic component mounting area is arranged to be situated between the edge portion and the second driver IC, the wiring lines routed from the above-described electronic component mounting area to the first driver IC through the edge portion, and the wiring lines routed from the electronic component mounting area to the second driver IC can be easily formed.

Furthermore, to solve the above-described problems, the present invention provides an electro-optical device. This electro-optical device comprises an electro-optical panel having a panel substrate holding an electro-optical substance, and a first driver IC mounted in the area which includes one side of the panel substrate; a base material wherein the edge portion thereof is bonded to the vicinity of the one side of the panel substrate; a second driver IC mounted on the surface of the base material; and driver-controlling electronic components which are mounted on the same surface as the second driver in the base material, and which produce control signals to be provided to the first and second driver ICs.

According to this electro-optical device, for the same reason that was explained regarding the above-described flexible substrate, the shape of the picture-frame like region in the electro-optical device can be made symmetrical with respect to the axis in the direction perpendicular to the above-described one side. Furthermore, since the second driver IC and the driver-controlling electronic components are mounted on the same surface in the base material, the processes of mounting these on the base material can be facilitated. In addition, in this electro-optical device, if an arrangement is adopted wherein, in the base material, the driver-controlling electronic components are mounted in the electronic component mounting area situated between the edge portion bonded to the above-described panel substrate and the area where the second driver IC is mounted, the wiring lines extending out of the electronic component mounting area could be easily routed, in addition to providing the above-described effect.

Moreover, to solve the above-described problems, the present invention provides an electro-optical device. This electro-optical device comprises an electro-optical panel having a panel substrate holding an electro-optical substance, and a first driver IC mounted in the area which includes one side of the panel substrate; a base material wherein the edge portion thereof is bonded to the vicinity of the one side of the panel substrate; a second driver IC mounted on the surface of the base material; and driver-controlling electronic components, which are mounted in the electronic component mounting area situated between the edge portion bonded to the panel substrate and the area where the second driver IC are mounted, in the base material, which produce control signals to be provided to the first and second driver ICs. According to this electro-optical device, since the electronic component mounting area is disposed between the edge portion and the second driver IC, the wiring lines extending out of the electronic component mounting area could be easily routed.

Preferably, the above-described electro-optical device has an arrangement further comprising first input wiring lines which are formed on one surface of the base material, and which are used for connecting the driver-controlling electronic components to the first driver IC; and second input wiring lines which are formed on the other surface of the base material, and which are used for connecting the driver-controlling electronic components to the second driver IC. Thereby, it suffices for only one of the first and second input wiring lines to be connected to the driver-controlling electronic components through the intermediary of the base material. More specifically, if an arrangement is adopted wherein the first input wiring lines are formed on the surface opposite to the electronic components mounting area in the base material, while the second input wiring lines are formed on the same surface as the electronic components mounting area in the base material, it will suffice for only the first input wiring lines to be connected with the electronic component mounting area through the intermediary of the base material. On the other hand, the second input wiring lines could be connected to the electronic component mounting area on the same surface without the intermediary of the base material.

When the driver-controlling electronic components are electrically connected with the input wiring lines formed on the surface opposite to these driver-controlling electronic components, it is preferable that the connection therebetween be established via through holes formed in the electronic component mounting area in the base material. Moreover, it is preferable that the through holes be formed in the land areas to which the terminals of the driver-controlling electronic components are connected. This eliminates the necessity to form through holes in the midway portions of the wiring lines (i.e., portions other than the lands), thereby allowing the distance between wiring lines to be reduced.

Furthermore, to solve the above-described problems, the electronic device according to the present invention has the above-described electro-optical device as a display portion. As described above, since the electro-optical device according to the present invention is arranged so that the shape of the picture-frame like region thereof is symmetrical with respect to a particular axis, it is suitable especially for an electronic device having an enclosure which is formed symmetrically with respect to the particular axis, as an enclosure for accommodating this electro-optical device.

BRIEF DESCRIPTION OF THE DRAWINGS

FIG. 7($a$) is a plan view showing the configuration of the connection portions between driver-controlling electronic components and wiring lines, and FIG. 7($b$) is a sectional view showing the connection portions in FIG. 7($a$), taken along the line D–D' therein.

FIG. 9($a$) is a perspective view showing the configuration of a personal computer as an example of electronic device to which the electro-optical device according to the present invention has been applied, and FIG. 9($b$) is a perspective view showing the configuration of a portable telephone as an example of electronic device to which the electro-optical device according to the present invention has been applied.

DETAILED DESCRIPTION OF THE PREFERRED EMBODIMENTS

Hereinafter, an embodiment according to the present invention will be described with reference to the accompanying drawings. The present embodiment shows only one aspect of the present invention, and the invention is not limited to the embodiment. It is therefore to be understood that changes and modifications may be arbitrarily made within the scope of the technical concept of the invention. Herein, as an electro-optical device according to the present invention, a liquid crystal display device using a liquid crystal as an electro-optical substance is shown by way of example.

Figure 1:
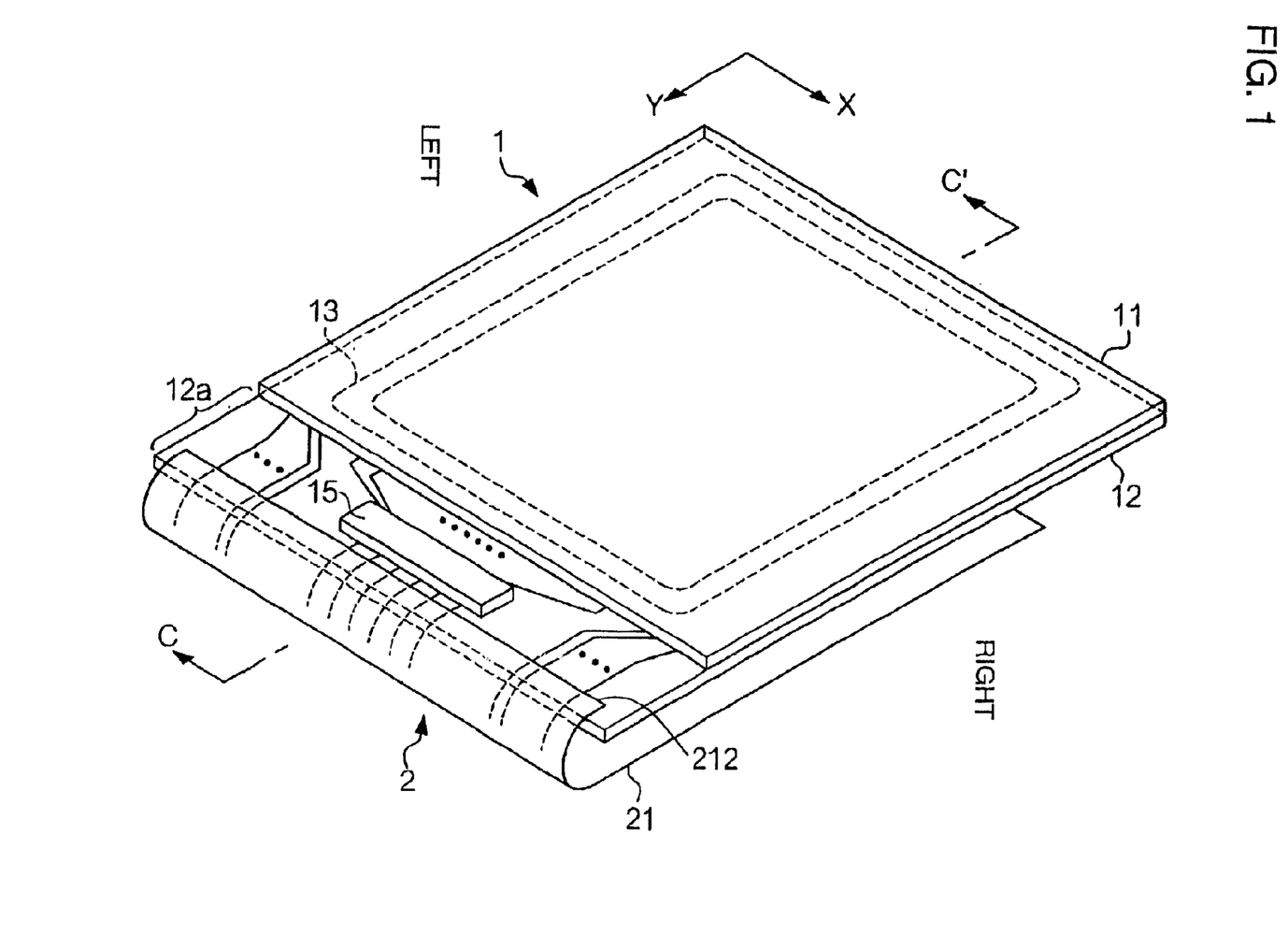
FIG. 1 is a perspective view showing the appearance of a liquid crystal display device according to an embodiment of the present invention.
Figure 2:
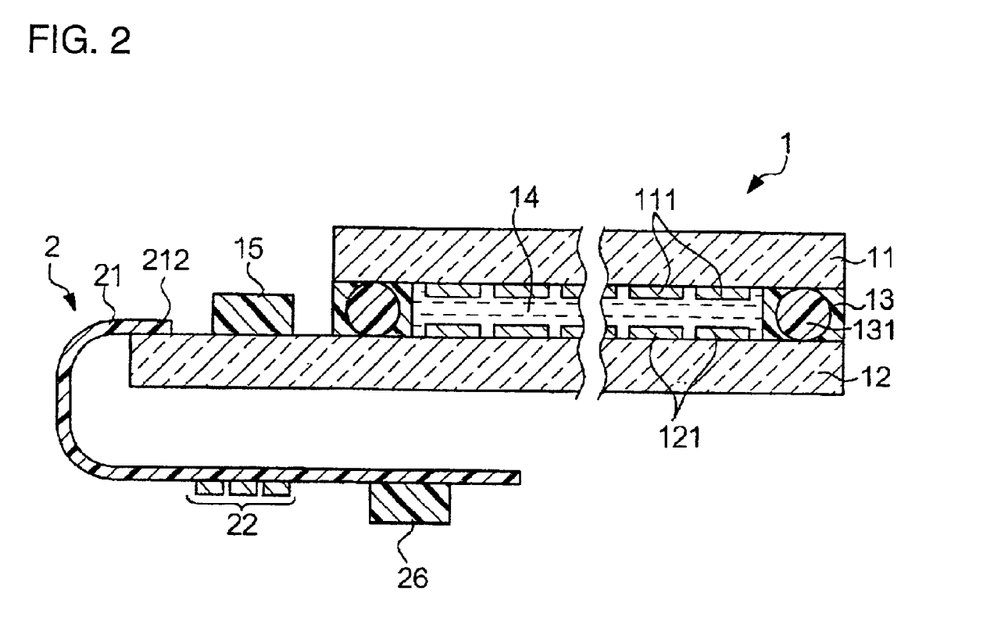
FIG. 2 is a sectional view of the liquid crystal display device in FIG. 1 taken along the line C–C' therein.

First, a description will be made of the configuration of a liquid crystal display device obtained by applying the present invention to the active-matrix type liquid crystal display device using TFDs (thin film diodes), each of which is a two-terminal type switching element, as switching elements. FIG. 1 is a perspective view showing the appearance of this liquid crystal display device. FIG. 2 is a sectional view of the liquid crystal display device in FIG. 1 taken along the line C–C' therein. Hereinafter, as shown in FIG. 1, the positive direction of the X-axis is denoted as "right", and the negative direction thereof is denoted as "left".

As shown in FIGS. 1 and 2, this liquid crystal display device comprises a liquid crystal display panel 1, and a flexible wiring substrate 2 connected thereto. The liquid crystal display panel 1 includes first and second panel substrates 11 and 12 which are adhered together with a substantially rectangular seal material 13 interposed therebetween; and a liquid crystal 14 enclosed in the area surrounded by both panel substrates and the seal material 13. Conductive particles 131 performing a function of a spacer for maintaining the gap (cell gap) between both panel substrates at a constant value are dispersed in the seal material 13. The second panel substrate 12 has an area projecting on one side with respect to the first panel substrate 11 (i.e., an area which does not face the first panel substrate 11). Hereinafter, this area is referred to as a "projecting area 12a".

On the other hand, in the flexible wiring substrate 2, the vicinity of its one edge portion (hereinafter, denoted as the "panel-side edge portion") 212 is bonded into the projecting area 12a in the second panel area 12 with an anisotropic conductive film interposed therebetween, and then folded so as to extend to the rear surface of the above-described liquid crystal display panel 1. Here, a backlight unit (not shown) for irradiating a light beam to the liquid crystal display panel 1 is disposed between the portion folded toward the rear surface of the liquid crystal display panel 1 in the flexible wiring substrate 2 and the second panel substrate 12.

Figure 3:
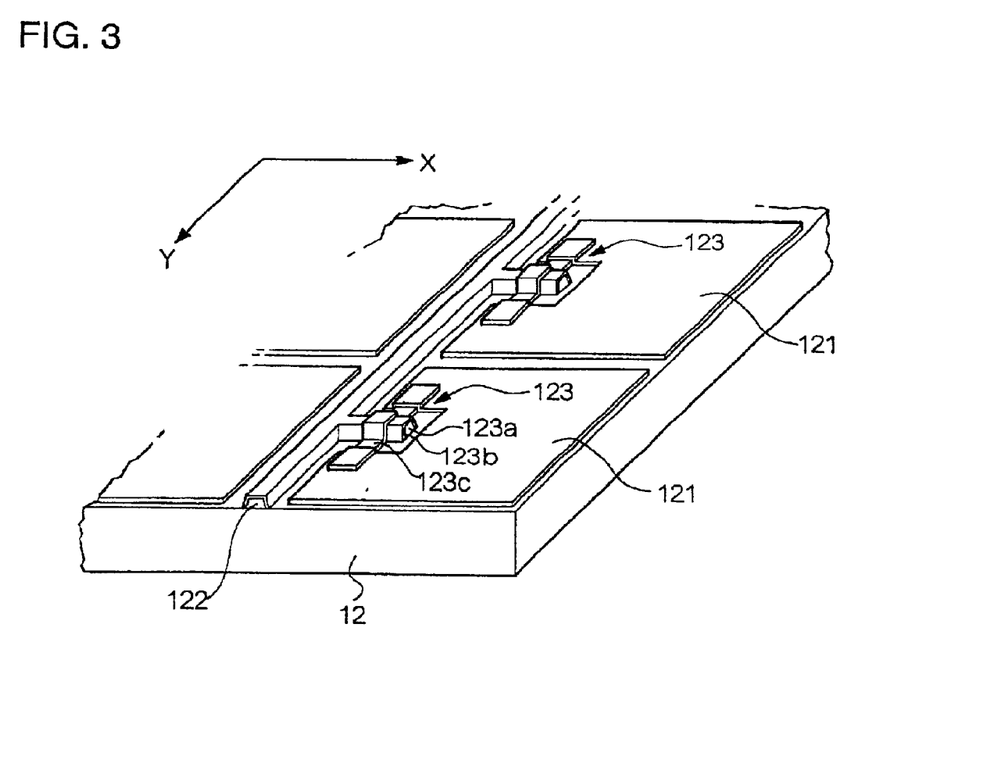
FIG. 3 is an enlarged perspective view showing the components on the second panel substrate of the liquid crystal display panel constituting the liquid crystal display device shown in FIG. 1.

The first and second panel substrates 11 and 12 of the liquid crystal display panel 1 are each transparent substrates constituted of glass or quartz. As shown in FIG. 3, on the inside surface (the liquid crystal 14 side) of the second panel substrate 12 among these panel substrates, a plurality of pixel electrodes 121 arrayed in a matrix shape, and a plurality of data lines 122 extending in the Y-direction in the gap portion between the pixel electrodes 121, are formed. Each of the pixel electrodes 121 is formed of a transparent conductive material such as ITO (indium tin oxide). Each of the pixel electrodes 121 and one of the data lines 122 adjacent thereto are connected with each other through one of the TFDs 123. Each of the TFDs 123 is constituted of a first metallic film 123a, which is a portion branched off from the data line 122, an oxide film 123b formed on the surface of the first metallic film 123a due to anode oxidation or the like, and a second metallic film 123c formed on the oxide film 123b so as to be connected with the pixel electrodes 121. The TFD is a two-terminal type switching element having a non-linear current/voltage characteristic.

Figure 4:
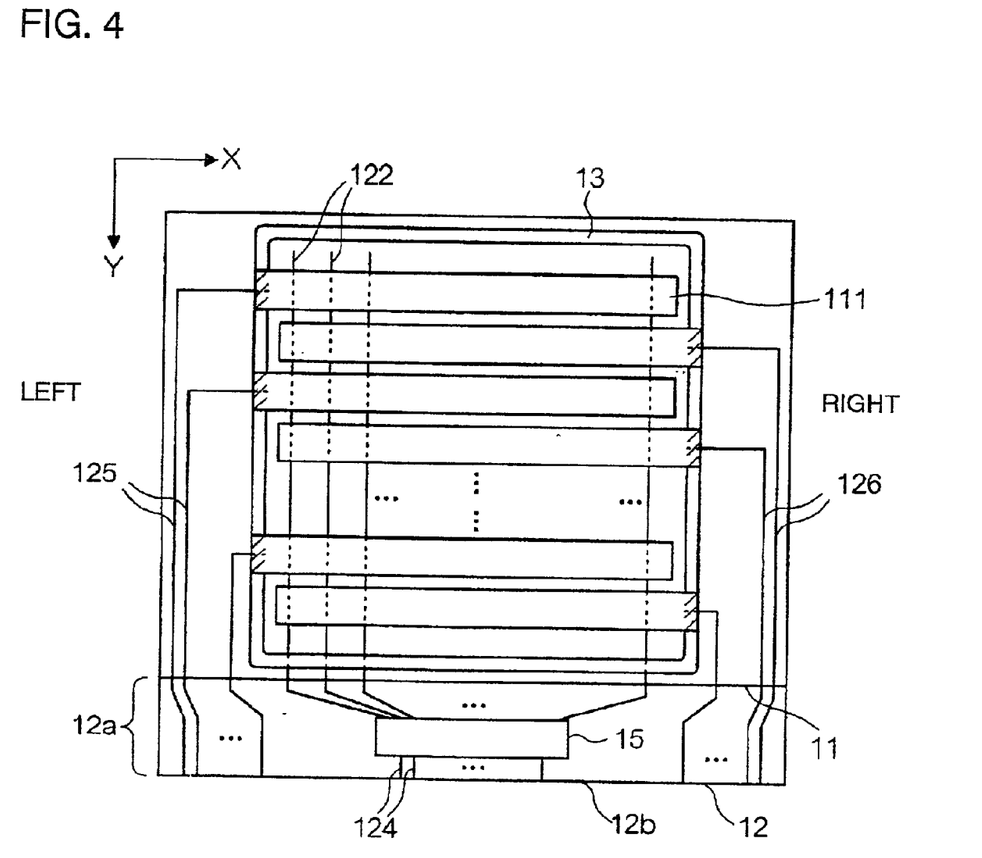
FIG. 4 is a plan view showing the layout of the wiring lines on the liquid crystal display panel.

FIG. 4 is a schematic view showing the layout of the wiring lines of the liquid crystal display panel 1 according to this embodiment. In FIG. 4, for the sake of simplification of the drawing, the illustrations of the pixel electrodes 121 and the TFDs 123 are omitted. As shown in FIG. 4, each of the data lines 122 extends into the projecting area 12a across one side of the seal material 13 (the lower side thereof in FIG. 4).

On the other hand, an X driver IC 15 is mounted by the COG mount technique in the vicinity of the central portion in the X-direction, in the projecting area 12a of the second panel substrate 12. The X driver IC 15 is used for supplying a data signal to each of the data lines 122, and is mounted on the second panel substrate 12 with the anisotropic conductive film formed by dispersing conductive particles in an adhesive interposed therebetween. Specifically, the end portion which has extended to the projecting area 12a, of each of the data lines 122, and one of the output terminals of the X driver IC 15, are arranged to be electrically connected to each other with the anisotropic conductive film interposed therebetween. In addition, in the projecting area 12a, a plurality of panel terminals 124 extending from the projecting area of the X driver IC 15 to the outer edge portion 12b of the second panel substrate 12, is formed. Each of the panel terminals 124 is connected to one of the input terminals of the X driver IC 15 with the conductive particles in the anisotropic film interposed therebetween.

Next, on the inside surface (the liquid crystal 14 side) of the first panel substrate 11, a plurality of scanning lines 111 extending in the direction perpendicular to the data lines 122, i.e., in the X-direction, is formed. Each of the scanning lines 111 is a belt-like electrode formed of a transparent conductive material such as ITO, and arranged to be opposite to a plurality of pixel electrodes 121 arrayed on the second panel substrate 12. The plurality of scanning lines 111 in this embodiment are arranged to be alternately led out to the left and right sides for every line, and the led-out end portions are arranged to be overlaid on the seal material 13. Specifically, in FIG. 4, each of the odd-numbered scanning lines 111 as counted from above, extends so as to be overlaid on the left side of the seal material 13 (in other words, so as to be sandwiched between the first panel substrate 11 and the seal material 13), while each of the even-numbered scanning lines 111 extends so as to be overlaid on the right side of the seal material 13.

On the other hand, the areas on the left side and the right side of the seal material 13 in the second panel substrate 12 have a plurality of first wiring lines 125 and a plurality of second wiring lines 126 which are formed thereon, respectively. Each of the first wiring lines 125 extends so that one end thereof contacts the left side of the seal material 13, and reaches the outer edge portion 12b of the projecting area 12a through the left side of the X driver IC 15. Likewise, each of the second wiring lines 126 extends so that one end thereof contacts the right side of the seal material 13, and reaches the outer edge portion 12b through the right side of the X driver IC 15. With such an arrangement, each of the plurality of scanning lines 111 formed on the first panel substrate 11 is electrically connected to one of the fist wiring lines 125 or one of the second wiring lines 126 with the conductive particles 131 dispersed in the seal material 13 interposed therebetween. More specifically, among the plurality of scanning lines 111, each of the odd-numbered scanning lines 111 is connected to one of the first wiring lines 125 through the left side of the seal material 13, while each of the even-numbered scanning lines 111 is connected to one of the second wiring lines 126 through the right side of the seal material 13.

Each of the inside surfaces of the first and second panel substrates 11 and 12 is covered with an oriented film which has been subjected to rubbing processing in a predetermined direction, while each of the outside surface thereof has a deflecting plate for deflecting an incident light beam, a phase-contrast plate for compensating for an interference color and the like which are adhered thereon. However, since the above-described arrangements are not directly related to the present invention, the illustration and description thereof are omitted here.

Next, the configuration of the flexible wiring substrate 2 will be described. As shown in FIGS. 1 and 2, this flexible wiring substrate 2 is configured so that wiring lines and various electronic components are provided on both surfaces of the film base material 21 which has flexibility. The film base material 21 is a film-shaped member formed of polyimide or the like. Hereinafter, when this flexible wiring substrate 2 is folded toward the rear surface of the liquid crystal display panel 1, the side facing the second panel substrate 12 in the flexible wiring substrate 2 is denoted as the "B side", and the other side thereof is denoted as the "A side".

Figure 5:
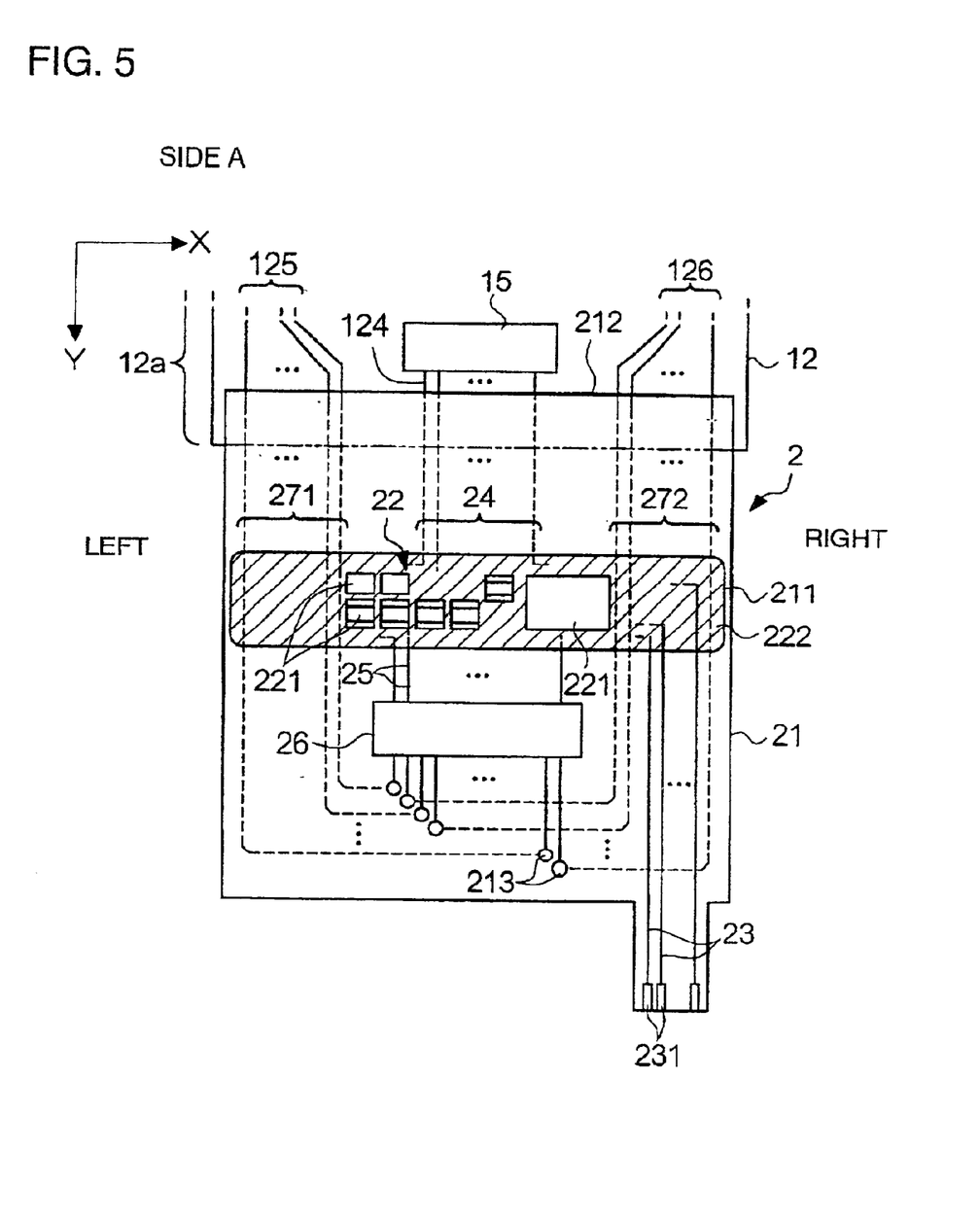
FIG. 5 is a plan view showing the configuration on the A side of a flexible wiring substrate constituting the liquid crystal display device.
Figure 6:
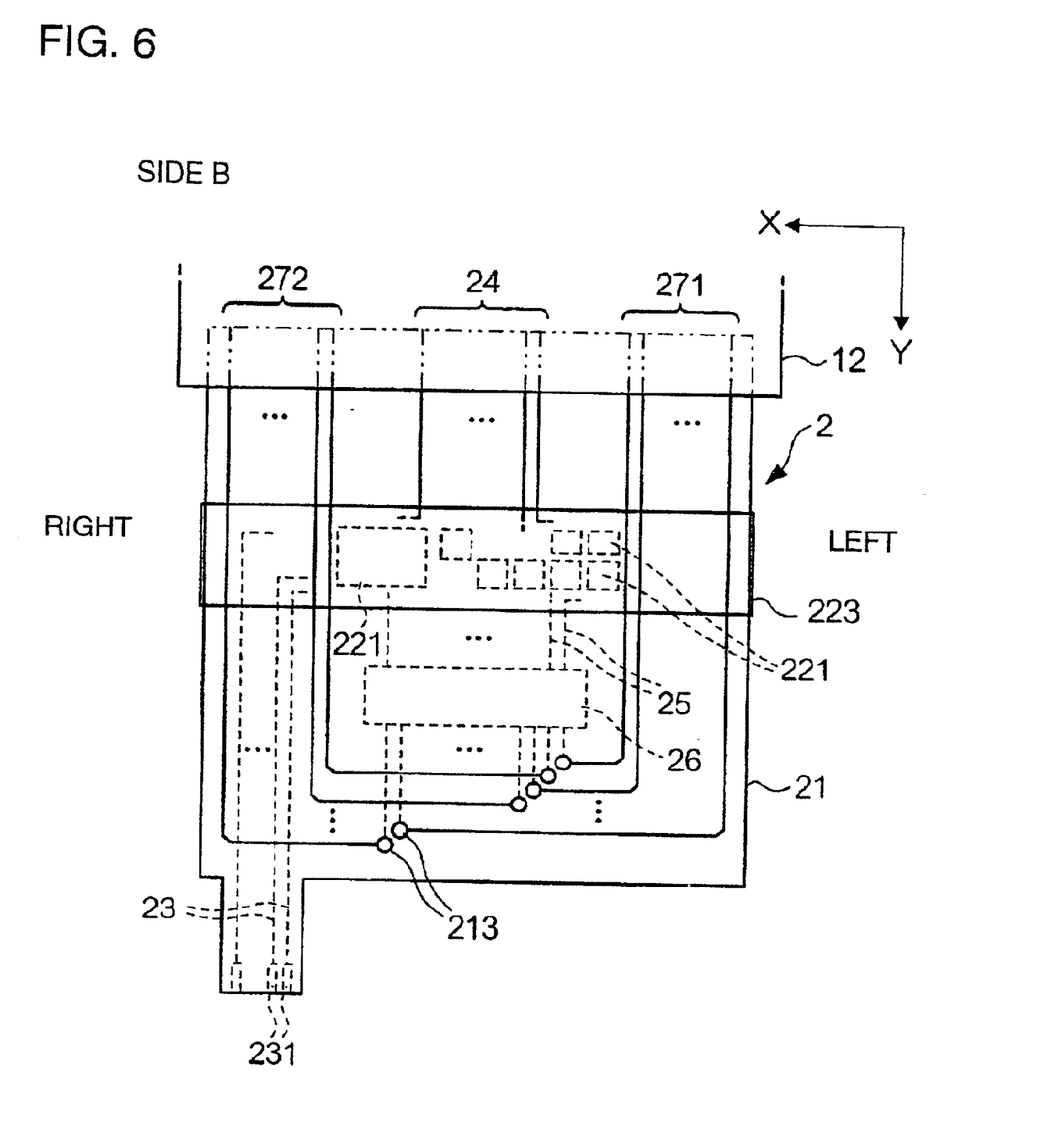
FIG. 6 is a plan view showing the configuration on the B side of the flexible wiring substrate.

FIG. 5 is a plan view showing the configuration on the A side of the flexible wiring substrate 2, while FIG. 6 is a plan view showing the configuration on the B side thereof. Note that the "left"-"right" relations in FIG. 5 and FIG. 6 are reverse with respect to each other. Meanwhile, as shown in FIGS. 1 and 2, in the real liquid crystal display device, the flexible wiring substrate 2 is folded toward the rear surface of the liquid crystal display panel 1, but, for convenience of explanation, FIGS. 5 and 6 show the state wherein the flexible wiring substrate 2 is not yet folded. In each of these figures, the wiring lines and the electronic components provided on the front side in the direction perpendicular to the plane of the figure with respect to the film base material 21 are indicated by solid lines, while those provided on the back side in the direction perpendicular to the plane of the figure with respect to the film base material 21 are indicated by broken lines.

As shown in these figures, on the surface of the film base material 21, there are provided driver-controlling electronic component group 22, external connection wiring lines 23, X driver input wiring lines 24, Y driver input wiring lines 25, a Y driver IC 26, and Y driver output wiring lines 27 (271 and 272). Each of the X driver input wiring lines 24, Y driver input wiring lines 25, and the Y driver output wiring lines 27 is, for example, wiring lines obtained by gold-plating a copper layer formed on the surface of the film base material 21.

The driver-controlling electronic component group 22 are constituted of a plurality of electronic devices 221 for producing the control signals (clock signals or the like) for defining the operations of the X driver IC 15 and the Y driver IC 26 based on the signals supplied by an external device (not shown) through the external connection wiring lines 23, and are mounted on the A side surface of the film base material 21.

The electronic components 221 comprise, for example, a chip on which a boosting circuit, an oscillation circuit, a power supply circuit, or the like is mounted, as well as a chip capacitor, and a resistor. The electronic component mounting area 211 (the hatched area in FIG. 5) including the portion where the driver-controlling electronic component group 22 in the film base material 21 is provided, is covered with an epoxy or acrylic resist 222. Since the electronic component mounting area 211 according to this embodiment is spaced apart to a certain extent from the panel-side edge portion 212 in the surface of the film base material 21, there is no risk that this electronic component mounting area 211 be folded even though the flexible wiring substrate 2 is folded to be mounted on the liquid crystal display panel 1. On the other hand, as shown in FIG. 6, on the area corresponding to the electronic component mounting area 211 in the B side surface of the film base material 21, a reinforcing plate 223 for supplementing the strength of this film base material 21 is adhered.

The external connection wiring lines 23 are wiring lines for connecting the external device with the driver-controlling electronic component group 22, and formed on the A side surface of the film base material 21. More specifically, each of the external connection wiring lines 23 is arranged so that it extends from the one end thereof where the external connection terminal 231 is formed, to the electronic component mounting area 211, and that the other end thereof is connected with one of the electronic components 221 in the electronic component mounting area 211.

The X driver input wiring lines 24 are formed on the B side surface of the film base material 21. The X driver input wiring lines 24 are arranged so that one end of each of them is connected to one of the electronic components 22 in the above-mentioned electronic component mounting area 211, and that the other end thereof extends to the panel-side edge portion 212. Also, in the state wherein the flexible wiring substrate 2 and the liquid crystal display panel 1 are connected with each other, the end portion of each of the X driver input wiring lines 24 which has reached the above-described panel-side edge portion 212, and one of the panel terminals 124 on the second panel substrate 12 are arranged to be electrically connected with the conductive particles in the anisotropic conductive film interposed therebetween. Thereby, the control signals produced by the driver-controlling electronic component group 22 are supplied to the X driver IC 15 through the X driver input wiring lines 24 and the panel terminals 124.

Each of the Y driver input wiring lines 25 is a wiring line for connecting each of the electronic components 221 and one of the input terminals of the Y driver IC 26, and is formed on the A side surface of the film base material 21. Namely, the X driver input wiring lines 24 and the Y driver input wiring lines 25 are formed on a surface different from each other in the film base material 21.

Figure 7:
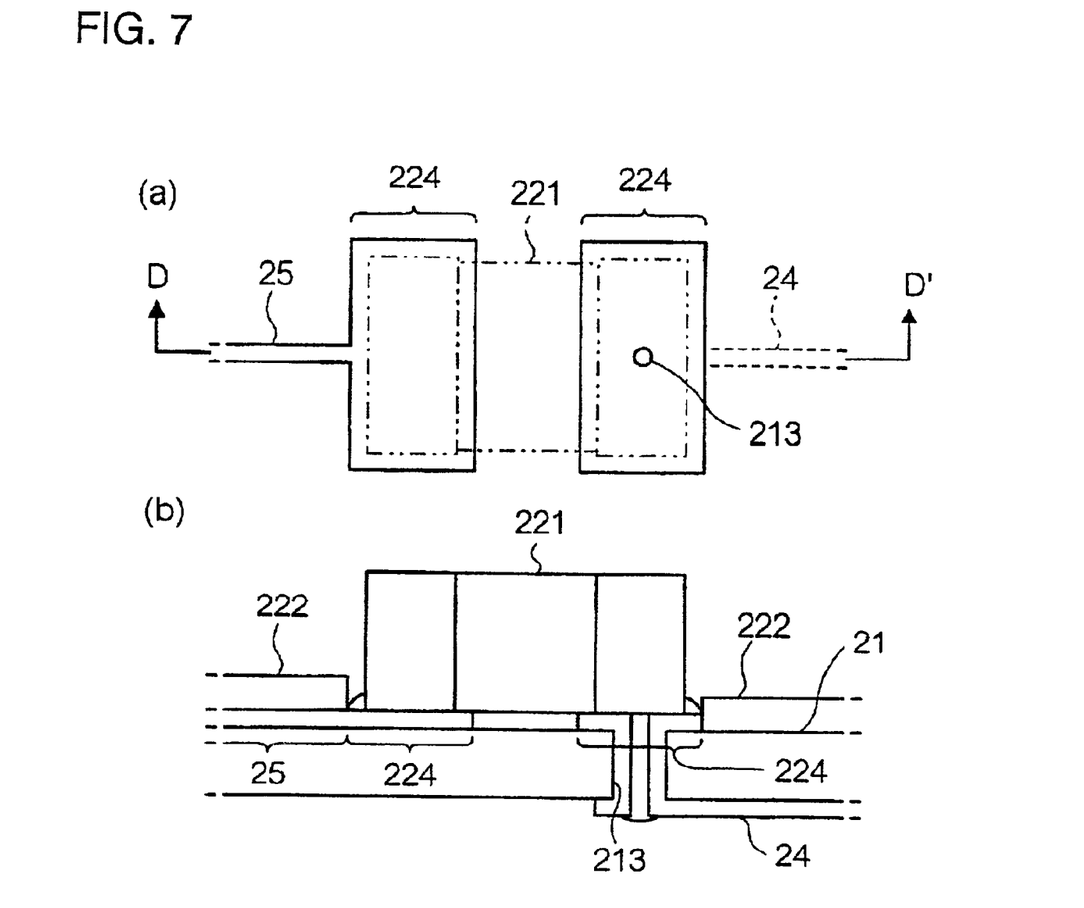

Here, the connection states of the X driver input wiring lines 24 and the Y driver input wiring lines 25 with the electronic device 221 (a chip capacitor in this case) will be described with reference to FIGS. 7(a) and 7(b). As described above, since the X driver input wiring lines 24 are formed on the B side surface of the film base material 21 while the electronic devices 221 are formed on the A side surface thereof, each of the X driver input wiring lines 24 and one of the electronic devices 221 are electrically connected via the through hole 213 provided in the film base material 21. This embodiment is arranged so that the above-described through holes 213 are provided in the lands 224 area where the terminals of the electronic devices 221 are disposed (i.e., in the electronic component mounting area 211), in the film base material 21. More specifically, as shown in FIGS. 7(a) and 7(b), the end portion of each of the X driver input wiring lines 24 is arranged to extend to the position opposite to one of the lands 224 with the film base material 21 interposed therebetween. That is, the above-described end portion and the land 224 are electrically connected with each other via through hole 213 which is provided in the film base material 21 so as to correspond to this end portion. In contrast, as shown in FIGS. 7(a) and 7(b), in each of the Y driver input wiring lines 25, the end portion thereof to be connected to one of the electronic components 221 is directly connected with the land 224 where the terminal of the above-described electronic device 221 is to be disposed. Herein, a chip capacitor has been shown as an example of electronic component 221, but other electronic devices 221 also have similar arrangements.

Returning to FIGS. 5 and 6, the Y driver IC 26 has a circuit for producing a scanning signal to be supplied to each of the scanning lines 111 in the liquid crystal display panel 1, based on the control signals supplied from the driver-controlling electronic component group 22 through the Y driver input wiring lines 25. As in the case of the driver-controlling electronic component group 22, this Y driver IC 26 is mounted on the A side surface of the film base material 21. Furthermore, the Y driver IC 26 is mounted on the opposite side of the panel-side edge portion 212 with respect to the electronic component mounting area 211, in the A side surface of the film base material 21. In other worlds, as shown in FIG. 5, in the state wherein the flexible wiring substrate 2 is mounted on the liquid crystal display panel 1, the electronic component mounting area 211 is positioned between the X driver IC 15 and the Y driver IC 26.

The Y driver IC 26 has a plurality of output terminals (not shown) which are arranged in lines along the long side thereof. In the Y driver IC 26, the order of the arrangement of the plurality of output terminals agrees with the order of the arrangement of the plurality of scanning lines 111 each of which is to be provided with a scanning signal from one of the output terminals. Specifically, for example, the scanning signal to be provided to the first scanning line 111 as viewed from above is output from the first output terminal as viewed from the end, and the scanning signal to be provided to the second scanning line 111 as viewed from above is output from the second output terminal viewed from the end, and so forth. Here, the number of the wiring lines connected to the terminals of the Y driver IC 26 (i.e., the Y driver input wiring lines 25 and the Y driver output wiring lines 27) is larger than that of the wiring lines connected to the terminals of the X driver IC 15 (i.e., the panel terminals 124 and the data lines 122). Namely, in this embodiment, among the driver ICs for driving the liquid crystal 14, the driver IC wherein the number of wiring lines connected thereto is relatively small (i.e., the X driver IC 15) is mounted on the second panel substrate 12 by the COG mount technique.

Next, the Y driver output wiring lines 27 are wiring lines for connecting the output terminals of the Y driver IC 26 with each of the first wiring lines 125 and the second wiring lines 126 on the second panel substrate 12, and extend from the output terminals of the Y driver IC 26 to the panel-side edge portion 212. In this embodiment, the plurality of scanning lines 111 is alternately led out to the left and right sides for every line, and connected to each of the first wiring lines 125 and the second wiring lines 126. On the other hand, as described above, the Y driver IC 26 in this embodiment is arranged so that the order of the arrangement of the plurality of output terminals which is arranged in lines along the long side thereof, agrees with the order of the arrangement of the plurality of scanning lines 111 each of which is to be provided with a scanning signal from one of the output terminals. Therefore, with regard to the Y driver output wiring lines 271 which are each connected to the odd-numbered output terminals of the Y driver IC 26 among the plurality of Y driver output wiring lines 27, it is necessary to be led out so as to extend to the left-side portion of the panel-side edge portion 212 to connect to the first wiring lines 125 each connected to the odd-numbered scanning lines 111. On the other hand, with regard to the Y driver output wiring lines 272 which are each connected to the even-numbered output terminals, it is necessary to be led out so as to extend to the right-side portion of the panel-side edge portion 212 to connect to the second wiring lines 126 which are each connected to the even-numbered scanning lines 111. However, if the Y driver output wiring lines 27 are formed only on one surface of the base material 21 in the entire length thereof, each of the odd-numbered Y driver output wiring lines 271 and one of the even-numbered Y driver output wiring lines 272 which is adjacent thereto will intersect each other. This embodiment, therefore, is arranged so that one portion of each of the Y driver output wiring lines 27 is provided on the B side surface of the film base material 21 while the other portion thereof is provided on the A side surface of the film base material 21, and that these two portions are connected via one of the through holes 213.

More specifically, as shown in FIGS. 5 and 6, the Y driver output wiring lines 271 connected to one of the odd-numbered output terminals extends on the A side surface of the film base material 21 from the above-mentioned output terminal in the positive direction of the Y-axis, and reaches at the B side surface of the film base material 21 via one of the through holes 213. Then, the Y driver output wiring line 271 is folded to the left side at the above-described through hole 213, and extends on the B side surface of the film base material 21 to the left-side portion of the panel-side edge portion 212. The Y driver output wiring line 271 which has reached the panel-side edge portion 212 is electrically connected with one of the first wiring lines 125 on the second panel substrate 12 with the conductive particles in the anisotropic conductive film interposed therebetween. Thereby, the scanning signal output from each of the odd-numbered output terminals of the Y driver IC 26 is supplied to one of the odd-numbered scanning lines 111 through the corresponding Y driver output wiring line 271 and first wiring line 125.

On the other hand, each of the Y driver output wiring lines 272 connected to one of the even-numbered output terminals extends from the A side surface of the film base material 21 to the B side surface via one of the through holes 213, as in the case of the Y driver output wiring lines 271. However, unlike the Y driver output wiring lines 271, each of the Y driver output wiring lines 272 is folded to the right side at the above-described through hole 213, and extends on the B side surface of the film base material 21 to the right-side portion of the panel-side edge portion 212. The Y driver output wiring line 272 which has reached the panel-side edge portion 212 is electrically connected with one of the second wiring lines 126 on the second panel substrate 12 with the conductive particles in the anisotropic conductive film interposed therebetween. Thereby, the scanning signal output from each of the even-numbered output terminals of the Y driver IC 26 is supplied to one of the even-numbered scanning lines 111.

As described above, this embodiment is arranged so that an X driver IC 15 is mounted in the projecting area 12a including the one side (the outer edge portion 12b) of the second panel substrate 12, and that a flexible wiring substrate 2 on which the Y drive IC 26 is mounted, is bonded to the vicinity of the above-described one side. As a result, the picture-frame like region in the liquid crystal display panel 1 can be symmetrical with respect to the axis parallel to the Y-direction (more specifically, with respect to the center line of the first panel substrate 11 or the second panel substrate 12). Therefore, when the liquid crystal display panel 1 is accommodated in an enclosure having a bilaterally symmetrical shape, the mechanism for supporting the liquid crystal display panel 1 inside the above-mentioned enclosure can be made bilaterally symmetrical. This allows the design and production of the enclosure to be facilitated.

Also, according to this embodiment, the second panel substrate 12 has a projecting area 12a with respect to the first panel substrate 11, whereas the first panel substrate 11 has no such a projecting area. This embodiment, therefore, has an advantage in that it can reduce the area of the picture-frame like region, over conventional electro-optical devices wherein either of the panel substrates has a projecting area which projects with respect to the other panel substrate.

Furthermore, according to this embodiment, the Y driver IC 26 and the driver-controlling electronic component group 22 are mounted on the same surface in the film base material 21. Thereby, this embodiment has another advantage in that the process of mounting the Y driver IC 26 on the film base material 21 on which the driver-controlling electronic component group 22 is disposed, can be facilitated. More detailed discussion will be provided on this aspect below.

Here, as a comparative example with respect to this embodiment, a case is supposed where the Y driver IC 26 and the driver-controlling electronic component group 22 are mounted on surfaces different from each other. In this case, for example, after the driver-controlling electronic component group 22 has been mounted on one surface of the film base material 21, the Y driver IC 26 is press-bonded to the other surface thereof with the anisotropic conductive film interposed therebetween. In the mounting process of this Y driver IC 26, it is necessary to place the film base material 21 on a pedestal so that the surface on which the Y driver IC 26 is to be mounted has a face up orientation. However, since electronic components 221 have already been projectingly mounted on the other surface of this film base material 21, the position of the film base material 21 must be selected so that the electronic components 221 are not placed on the top surface of the pedestal 3, as shown in FIG. 8(a).

Figure 8:
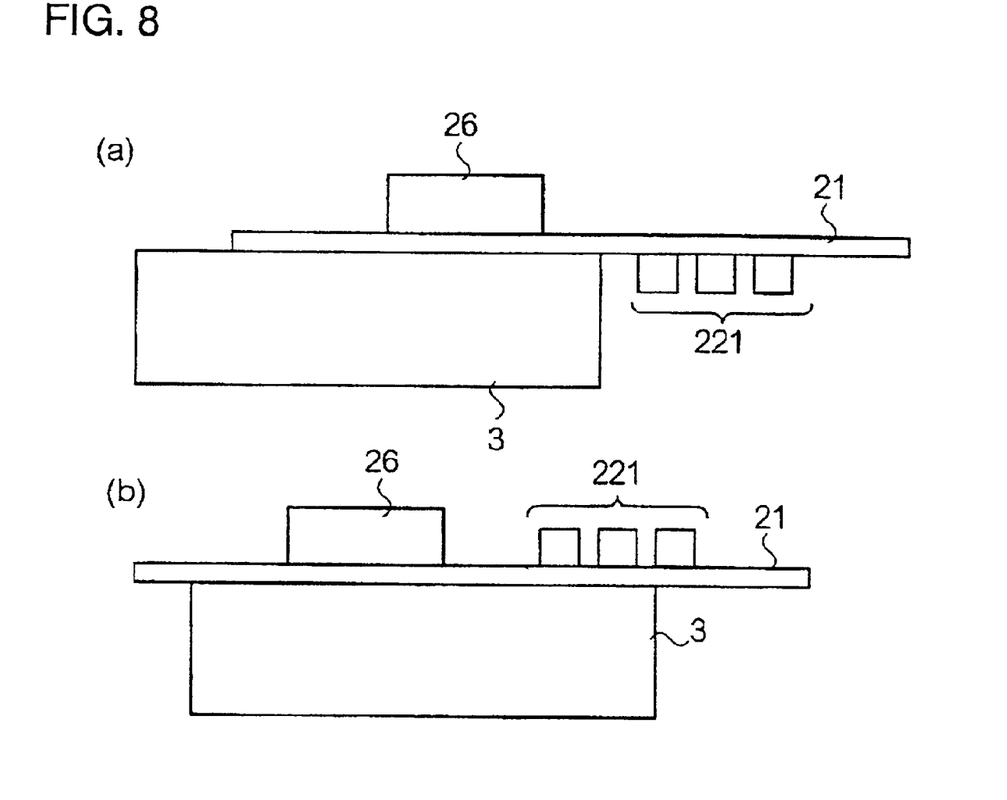
FIG. 8 is a sectional view explaining the process of mounting a Y driver IC on a film base material.

In contrast, according to this embodiment, the Y driver IC 26 and the electronic components 22 are formed on the same surface, and therefore, in the mounting process of the Y driver IC 26, it is unnecessary to limit the position where the film base material 21 is to be place to a particular position, as shown in FIG. 8(b). As a result, the mounting of the Y driver IC 26 can be facilitated.

Also, this embodiment is arranged so that the X driver input wiring lines 24 and the Y driver input wiring lines 25 are formed on surfaces different from each other in the film base material 21. Considering that either of the input wiring lines must be formed on the B side surface at the panel-side edge portion 212 of the film base material 21, both of the X and Y driver input wiring lines can be formed on the B side surface of the film base material 21. In this case, however, either the X driver input wiring lines 24 or the Y driver input wiring lines 25 requires through holes 213 for connecting them with the driver-controlling electronic component group 22 situated on the A side. In contrast, in this embodiment, since the X driver input wiring lines 24 and the driver input wiring lines 25 are formed on surfaces different from each other, it suffices to form through holes only for the X driver input wiring lines 24. This allows the production process of the flexible wiring substrate 2 to be facilitated, and enables the reduction in the production cost to be realized.

In addition, in this embodiment, through holes 213 for connecting the electronic components 221 and the X driver input wiring lines 24 are formed in the land 224 areas where the electronic components 221 are mounted. In general, each of the through holes 213 has a diameter larger than the width of the wiring line, and therefore, when the through holes 213 are provided at midway portions of the wiring lines (i.e., portions other than the lands 224), it is necessary to secure a wide spacing among the wiring lines. In contrast, when through holes 213 are provided in the land 224 areas each having a width larger than that of the wiring line, this provides an advantage in that the spacing among the wiring lines can be reduced without the need to consider the diameter of the through holes 213 with regard to the midway portion of the wiring lines.

While the present invention has been described with reference to an embodiment thereof, it is to be understood that the embodiment has been shown by way of example, and that various modifications may be made thereto without departing from the true spirit and scope of the invention. As modifications, the following will be taken as examples.

(1) In the above-described embodiment, the case has been proposed where a projecting area 12a which projects with respect to the first panel substrate 11 situated on the observation side is provided on the second panel substrate 12 situated on the rear surface side, and where an X driver IC 15 is mounted on the above-described projecting area 12a by the COG mount technique. Conversely, however, the configuration wherein a projecting area which projects with respect to the second panel substrate 12 is provided on the first panel substrate 11 situated on the observation side, and wherein an X driver IC 15 is mounted on the above-mentioned projecting area by the COG mount technique, may be adopted. In this case, the flexible wiring substrate 2 is arranged so that the panel-side edge portion 212 thereof is bonded to the projecting portion of the first panel substrate 11, and that the flexible wiring substrate 2 is folded to the rear surface side of the second panel substrate 12.

(2) The above-described embodiment has been arranged to use the X driver IC 15 wherein a circuit for supplying data signals to the plurality of data lines 122 is mounted on a chip. Alternatively, however, the configuration wherein such a circuit is divided and wherein each of these divided circuits is installed on a mutually different chip to be mounted on the second panel substrate 12 by the COG mount technique, may be employed. The same goes for the Y driver IC; a plurality of Y driver ICs each of which supplies scanning signals to the scanning lines 111 may be mounted on the film base material 21.

(3) In the above-described embodiment, a Y driver IC 26 has been used wherein the order of the arrangement of the plurality of output terminals agrees with the order of the arrangement of the plurality of scanning lines 111 each of which is to be provided with a scanning signal from one of the output terminals. In this case, the above-described Y driver IC 26 can be used not only in the liquid crystal display device shown in the description of the above-described embodiment which routes the plurality of scanning lines 111 on opposite sides through the first wiring lines 125 and the second wiring lines 126, but also in the liquid crystal display device which routes the scanning lines 111 from one side. This provides an advantage in that a general versatility of chip can be secured. However, if it is unnecessary to consider such a general versatility, the configuration for a Y driver IC 26 may be used wherein the plurality of output terminals thereof formed in a line along the long side thereof are separated into two groups at the center portion of the above-mentioned line, wherein a scanning signal is output from each of the output terminals belonging to one group to one of the odd-numbered scanning lines 111, and wherein a scanning signal is output from each of the output terminals belonging to the other group to one of the even-numbered scanning lines 111. This provides an advantage in that the configuration of the Y driver output wiring lines 27 can be significantly simplified over the above-described embodiment. In other words, this eliminates the necessity to intersect the Y driver output wiring lines which are each connected to the odd-numbered output terminals with the Y driver output wiring lines which are each connected to the even-numbered output terminals.

(4) In the above-described embodiment, an active-matrix type liquid crystal display device using TFDs 123, which is a two-terminal type switching element, has been shown as an example. However, needless to say, the present invention can be instead applied to a liquid crystal display device using a three-terminal type switching element typified by a TFT (thin film transistor), or a passive-matrix type liquid crystal display device without a switching element.

Also, in the above-described embodiment, the case where the present invention has been applied to the liquid crystal display device using the liquid crystal 14 as an electro-optical substance, has been shown as an example. Alternatively, however, the present invention can be applied to various devices which use an EL (electroluminescence) element typified by an organic EL element, as an electro-optical substance, and which perform display operations by the electro-optical effects thereof. That is, the present invention can be applied to any electro-optical device which has an arrangement wherein wiring lines are formed on the edge area of the panel substrate, irrespective of the configurations of the other components. Meanwhile, as in the electro-optical device using an EL element as an electro-optical substance, when an arrangement is adopted wherein only a single panel substrate is used as a substrate for holding an electro-optical substance, the area where an X driver IC (an IC chip on the panel) and a flexible wiring substrate are disposed, becomes the area which includes one side of the above-described panel substrate. Namely, in the panel substrates of the electro-optical device according to the present invention, the area on which the first driver IC is to be mounted and to which the base material of the flexible substrate is to be bonded, is not limited to the area projecting from the other panel substrate, but includes the area along one side of the panel substrate.

Next, electronic devices using the electro-optical device according to the present invention will be described.

(1) Mobile Computer

Figure 9:
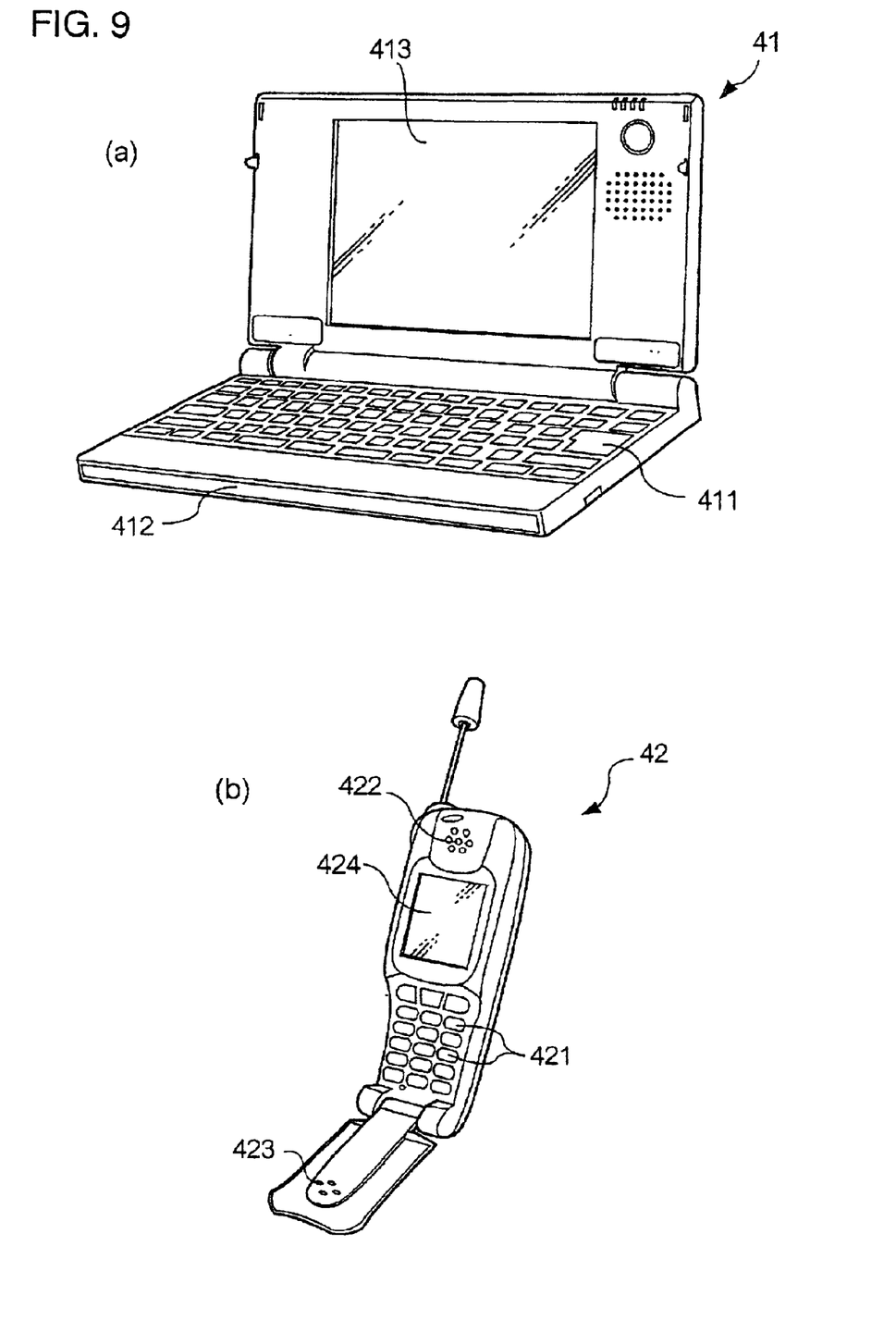

First, a description will be made of an example of a personal computer obtained by applying the electro-optical device according to the present invention to the display portion of the mobile personal computer (so-called note-type personal computer). FIG. 9(*a*) is a perspective view showing the configuration of this personal computer. As shown in the figure, the personal computer 41 comprises a main body portion 412 having a keyboard 411, and a display portion 413 to which the electro-optical device according to the present invention has been applied.

(2) Portable Telephone

Next, a description will be made of an example of a portable telephone obtained by applying the electro-optical device according to the present invention to the display portion of the portable telephone. FIG. 9(*b*) is a perspective view showing the configuration of this portable telephone. As shown in the figure, the portable telephone 42 comprises a plurality of control buttons 421, an earpiece 422, a mouthpiece 423, and a display portion 424 to which the electro-optical device according to the present invention has been applied.

Besides the personal computer shown in FIG. 9(*a*) and the portable telephone shown in FIG. 9(*b*), the electronic devices to which the electro-optical device according to the present invention can be applied, include liquid crystal televisions, viewfinder type/monitor direct-viewing type video tape recorders, car navigation devices, pagers, electronic notebooks, electronic calculators, word processors, workstations, television telephones, POS terminals, digital still cameras, etc. As described above, according to the electro-optical device of the present invention, since the shape of the picture-frame like region can be made symmetrical with respect to the axis perpendicular to the direction of the one side belonging the projecting area in the panel substrate, i.e., with respect to the center line of the panel substrate, it is possible to improve the flexibility in the design of the electronic device equipped with such an electro-optical device, and to facilitate the production thereof.

As already described, according to the electro-optical device of the present invention, the shape of the picture-frame like region can be made symmetrical.

The entire disclosure of Japanese Patent Application No. 2001-054609 filed Feb. 28, 2001 is incorporated by reference herein.

What is claimed is:

1. A flexible substrate bonded to an electro-optical panel in which a first driver IC is mounted in an area on one side of a panel substrate, said flexible substrate comprising:

a base material having an edge portion directly bonded to a vicinity of said one side of said panel substrate;

a second driver IC mounted on one surface of said base material; and driver-controlling electronic components mounted on said one surface of said base material, and which produce control signals to be provided to said first and second driver ICs;

wherein said driver controlling electronic components and said second driver IC are mounted on the same suface of the base material.

2. A flexible substrate according to claim 1, wherein said base material and said flexible substrate are directly bonded by anisotropic conductive films.

3. A flexible substrate bonded to an electro-optical panel in which a first driver IC is mounted in an area on one side of a panel substrate, said flexible substrate comprising:

a base material having an edge portion directly bonded to a vicinity of said one side of said panel substrate;

a second driver IC mounted on one surface of said base material; and driver-controlling electronic components mounted in an electronic component mounting area situated between the edge portion bonded to said panel substrate and an area where said second driver IC are mounted on said base material, and which produce control signals to be provided to said first and second driver ICs;

wherein said drive; controlling electronic components and said second driver IC are mounted on the same surface of the base material.

4. A flexible substrate according to claim 3, wherein said base material and said flexible substrate are directly bonded by anisotropic conductive films.

5. An electro-optical device, comprising:

an electro-optical panel having a panel substrate holding an electro-optical substance;

a first driver IC mounted in the area on one side of said panel substrate;

a base material having an edge portion directly bonded to a vicinity of said one side of said panel substrate;

a second driver IC mounted on one surface of said base material; and driver-controlling electronic components mounted on said one surface of said base material, and which produce control signals to be provided to said first and second driver ICs.

6. An electro-optical device according to claim 5, wherein said driver-controlling electronic components are mounted in an electronic component mounting area situated between the edge portion bonded to said panel substrate and an area where said second driver IC are mounted on said base material.

7. An electro-optical device according to claim 5, further comprising:

first input wiring lines formed on a first surface of said base material and interconnecting said driver-controlling electronic components and said first driver IC; and second input wiring lines formed on a second surface of said base material and interconnecting said driver-controlling electronic components and said second driver IC.

8. An electronic device having the electro-optical device according to claim 5.

9. A flexible substrate according to claim 5, wherein said base material and said flexible substrate are directly bonded by anisotropic conductive films.

10. An electro-optical device according to claim 7, wherein said first input wiring lines are formed on the first surface opposite to said driver-controlling electronic components on said base material, and wherein said second input wiring lines are formed on the same surface as said driver-controlling electronic components on said base material.

11. An electro-optical device according to claim 7, wherein at least one of the first and second input wiring lines are formed on the first surface opposite to said driver-controlling electronic components, and are each electrically connected with said driver-controlling electronic components via through holes formed in said electronic component mounting area of said base material.

12. An electro-optical device according to claim 11, wherein said through holes are formed in a land area where the terminals of said driver-controlling electronic components are disposed.

13. An electro-optical device, comprising:

an electro-optical panel having a panel substrate holding an electro-optical substance;

a first driver IC mounted in an area on one side of said panel substrate;

a base material having an edge portion directly bonded to a vicinity of said one side of said panel substrate;

a second driver IC mounted on one surface of said base material; and driver-controlling electronic components mounted in an electronic component mounting area situated between the edge portion bonded to said panel substrate and an area where said second driver IC are mounted on said bass material, and which produce control signals to be provided to said first and second driver ICs;

wherein said driver controlling electronic components and said second driver IC are mounted on the same surface of the base material.

* * * * *